United States Patent
Muftuler et al.

(10) Patent No.: US 9,880,247 B2
(45) Date of Patent: Jan. 30, 2018

(54) SYSTEM AND METHOD FOR MAGNETIC RESONANCE IMAGING USING HIGHLY ACCELERATED PROJECTION IMAGING

(71) Applicant: THE MEDICAL COLLEGE OF WISCONSIN, Milwaukee, WI (US)

(72) Inventors: Lutfi Tugan Muftuler, Menomonee Falls, WI (US); Ali Ersoz, Milwaukee, WI (US); Volkan Emre Arpinar, Milwaukee, WI (US)

(73) Assignee: The Medical College of Wisconsin, Milwaukee, WI (US)

( * ) Notice: Subject to any disclaimer, the term of this patent is extended or adjusted under 35 U.S.C. 154(b) by 658 days.

(21) Appl. No.: 14/403,682

(22) PCT Filed: May 31, 2013

(86) PCT No.: PCT/US2013/043582
§ 371 (c)(1),
(2) Date: Nov. 25, 2014

(87) PCT Pub. No.: WO2013/181517
PCT Pub. Date: Dec. 5, 2013

(65) Prior Publication Data
US 2015/0137811 A1    May 21, 2015

Related U.S. Application Data (60) Provisional application No. 61/653,795, filed on May 31, 2012.

(51) Int. Cl.
*G01V 3/00* (2006.01)
*G01R 33/561* (2006.01)
(Continued)

(52) U.S. Cl.
CPC .......... *G01R 33/5611* (2013.01); *G01R 33/34* (2013.01); *G01R 33/385* (2013.01);
(Continued)

(58) Field of Classification Search
CPC .................................................. G01R 33/5611
(Continued)

(56) References Cited

U.S. PATENT DOCUMENTS

| 7,519,412 B2 | 4/2009 | Mistretta |
| 9,417,306 B2 * | 8/2016 | Griswold ........... G01R 33/5611 |

(Continued)

OTHER PUBLICATIONS

International Search Report and Written Opinion dated Nov. 15, 2013 in connection with PCT/US2013/043582.

(Continued)

*Primary Examiner* — Louis Arana
(74) *Attorney, Agent, or Firm* — Quarles & Brady LLP (57) ABSTRACT

A method for highly accelerated projection imaging ("HAPI") is provided. In this method, conventional linear gradients are used to obtain coil sensitivity-weighted projections of the object being imaged. Only a relatively small number of projections, such as sixteen or less, of the object are required to reconstruct a two-dimensional image of the object, unlike conventional projection imaging techniques. The relationship between the voxel values of the imaged object and the coil sensitivity-weighted projections is formulated as a linear system of equations and the reconstructed images are obtained by solving this matrix equation. This method advantageously allows higher acceleration rates compared to echo planar imaging ("EPI") with SENSE or GRAPPA acceleration. Moreover, the method does not require any additional or specialized hardware because hardware in conventional MRI scanners is adequate to implement the method.

17 Claims, 5 Drawing Sheets (51) Int. Cl.
*G01R 33/34* (2006.01)
*G01R 33/385* (2006.01)
*G01R 33/48* (2006.01)
*G06T 11/00* (2006.01)

(52) U.S. Cl.
CPC ........ *G01R 33/4824* (2013.01); *G06T 11/006* (2013.01); *G06T 11/008* (2013.01)

(58) Field of Classification Search
USPC .............................. 324/309, 307, 312, 314
See application file for complete search history.

(56) References Cited

U.S. PATENT DOCUMENTS

| | | | |
|---|---|---|---|
| 2008/0068016 A1 | 3/2008 | Gaddipati et al. | |
| 2008/0303521 A1* | 12/2008 | Beatty ................ | G01R 33/4824 324/312 |
| 2009/0238430 A1 | 9/2009 | Haider et al. | |
| 2011/0098552 A1 | 4/2011 | Takai | |
| 2011/0241678 A1 | 10/2011 | Weber et al. | |
| 2012/0081114 A1* | 4/2012 | Weller ................ | G01R 33/5611 324/309 |
| 2016/0274209 A1* | 9/2016 | Dannels ............. | G01R 33/4824 |

OTHER PUBLICATIONS

Ersoz Ali et al: "Highly accelerated projection imaging with coil sensitivity encoding for rapid MRI", Medical Physics, AIP, Melville, NY, US; vol. 40, No. 2; Feb. 1, 2012 (Feb. 1, 2013); pp. 22305-22305, XP012170986; ISSN: 0094-2405, DOI: 10.1118/1.4789488 ISBN: 978-1-930524-56-9.

Ersoz Ali et al: "Highly Accelerated Projection Imaging (HAPI) wiht coil sensitivity encoding", Proceedings of the International Society for Magnetic Resonance in Medicine, 21st Annual Meeting and Exhibition, Salt Lake City, UT, USA, Apr. 20-26, 2013, vol. 21, Apr. 6, 2013 (Apr. 6, 2013), p. 3831; XP055086538.

Gerrit Schultz et al: "Radial Imaging With Multipolar Magnetic Encoding Fields", IEEE Transactions on Medical Imagine, IEEE Service Center, Piscataway, NJ, US; vol. 30, No. 12; Dec. 1, 2011 (Dec. 1, 2011); pp. 2134-2145; XP011380089; ISSN: 0278-0062, DOI: 10.1109/TMI.2011.2164262.

Ciris P A et al: "0-space Imaging: Tailoring Encoding Gradients to Coil Profiles for Highly Accelerated Imaging", Proceedings of the Int'l Society for Magnetic Resonance in Medicine, 17th Scientific Meeting and Exhibition, Honolulu, Hawaii, USA, Jan. 1, 2009 (Jan. 1, 2009), p. 4556; XP007911831.

Daniel Gallican et al: "Practical considerations for in vivo MRI with higher dimensional spatial encoding", Magnetic Resonance Materials in Physics, Biology and Medicine, Chapman and Hall, London, GB; vol. 25, No. 6; Apr. 7, 2012 (Apr. 7, 2007); pp. 419-431; XP035144972; ISSN: 1352-8661, DOI: 10.1007/S10334-012-0314-Y.

Juergen Hennig et al: "Parallel imaging in non-bijective, curvilinear magnetic field gradients: a concept study", Magnetic Reosnance Materials in Physics, Biology and Medicine, Chapman and Hall, London, GB; vol. 21, No. 1-2; Feb. 26, 2008 (Feb. 26, 2008); pp. 5-14; XP019596833; ISSN: 1352-8661.

Kai Tobias Block et al: "Undersampled radial MRI with multiple coils. Iterative image reconstruction using a total variation constraint", Magnetic Resonance in Medicine, vol. 57, No. 6, May 29, 2007 (May 29, 2007), pp. 1086-1098; XP055007221; ISSN: 0740-3194, DOI: 10.1002/mrm.21236.

Pruessman K P et al: "Advance in sensitivity encoding with arbitrary k-space trajectories", Magnetic Resonance in Medicine, Academic Press., Duluth, MN, US; vol. 46, No. 4, Jan. 1, 2001 (Jan. 1, 2001); pp. 638-651; XP002288249, ISSN: 0740-3194, DOI: 10.1002/MRM.1241.

Pruessman K P et al: "Sense: Sensitivity Encoding for Fast MRI", Magnetic Resonance in Medicine, Academic Press., Duluth, MN, US; vol. 42, No. 5, Nov. 1, 1999 (Nov. 1, 1999); pp. 952-962; XP000866655, ISSN: 0740-3194, DOI: 10.1002/(SICI) 1522-2594 (199911) 42:5<952::A ID-MRM16<3.0.CO; 2-S.

Tugan Muftuler L et al: "An inverse method to design RF coil arrays optimized for SENSE imaging; SENSE optimized MRI RF coil", Physics in Medicine and Biology, Institute of Physics Publishing, Bristol GB; vol. 51, No. 24; Dec. 21, 2006 (Dec. 21, 2006); pp. 6457-6469; XP020096086; ISSN: 0031-9155, DOI: 10.1088/0031-9155/51/24/012.

Chen et al: "An optimization method for designing SENSE imaging RF coil arrays", Jnl. of Magnetic Resonance, Academic Press, Orlando, FL, US; vol. 186, No. 2, Jun. 8, 2007 (Jun. 8, 2007); pp. 273-281; XP022107115, ISSN: 1090-780, DOI: 10.1016/J.JMR.2007.03.014.

\* cited by examiner

SYSTEM AND METHOD FOR MAGNETIC RESONANCE IMAGING USING HIGHLY ACCELERATED PROJECTION IMAGING

CROSS-REFERENCE TO RELATED APPLICATIONS

This application represents the national stage entry of PCT International Application No. PCT/US2013/043582 filed May 31, 2013, which claims the benefit of U.S. provisional Patent Application 61/653,795, filed on May 31, 2012, both of which are incorporated herein by reference for all purposes.

BACKGROUND OF THE INVENTION

The field of the invention is systems and methods for magnetic resonance imaging ("MRI"). More particularly, the invention relates to systems and methods for magnetic resonance image reconstruction.

Magnetic resonance imaging ("MRI") typically requires long data acquisition times. One of the drawbacks of these long data acquisition periods is the possibility that motion artifacts can be introduced by the patient moving during the imaging scan. Long acquisition times also make it difficult to image moving organs. Breathing motions can be mitigated by acquiring data while the patients hold their breath; however, for long scan times this approach can cause discomfort for patients.

Some of the widely used MRI protocols require rapid data acquisitions to enable time-lapse imaging of biologic functions, such as real-time cardiovascular imaging or functional MRI ("fMRI"). Several rapid imaging techniques have been developed to address these needs; however, each of these imaging techniques has its own advantages and disadvantages. As a result of the still existing drawbacks of existing rapid imaging techniques, there remains a need for very high frame rates for cine MRI.

Currently the most widely used technique for rapid MRI is echo-planar imaging ("EPI"), which acquires data with periodic cycling of magnetic gradient fields after a single radio frequency ("RF") excitation. However, EPI has several drawbacks, such as geometric distortions due to low bandwidth in the phase-encoding direction, image blurring due to $T^*_2$ relaxation, and signal dropouts due to magnetic susceptibility variations. Moreover, EPI increases the risk of peripheral nerve stimulation in the patient because of the sequence of rapidly switching frequency-encoding gradients. When peripheral nerve stimulation occurs, it is generally experienced as a mild, albeit uncomfortable, vibratory sensation of the skin; however, in some instances it can be experienced as a painful response. Therefore, it is desirable to avoid peripheral nerve stimulation in the interest of patient comfort. Also, EPI produces very loud acoustic noise for extended periods, which is another source of patient discomfort.

More recently, parallel imaging techniques were introduced as an alternative for accelerating image acquisition by omitting several phase-encoding steps and using complementary information from an array of RF receiver coils. The distinct RF coil sensitivity profiles, $B_1^-$, can be used to synthesize missing information in the image domain, as in sensitivity encoding ("SENSE") techniques, or in k-space, as in simultaneous acquisition of spatial harmonics ("SMASH") and generalized auto calibrating partially parallel acquisitions ("GRAPPA") techniques. Parallel imaging techniques are capable of reducing the geometric distortions and image blurring present in EPI. However, the acceleration achieved by parallel imaging comes at the expense of reduced and nonuniform distribution of signal-to-noise ratio ("SNR"). The decrease in SNR is characterized by the so-called geometry factor ("g-factor"), which may lead to regions of very poor SNR. The g-factor is dependent on RF receive coil geometry and the amount of acceleration. Therefore, acceleration rates are usually kept at R=3 or lower because the SNR penalty increases progressively with increasing acceleration rate.

Several new parallel imaging methods have been introduced that utilize non-Cartesian gradient encoding schemes. Gradient fields with spherical or cylindrical geometry are typically used in these methods; these gradient fields usually have multiple field maxima and minima. This introduces spatial encoding ambiguity, which can be resolved using coil sensitivity profiles. One example of such a technique is known as parallel imaging technique using localized gradients ("PatLoc"). The major advantage of this technique is the reduced gradient field magnitudes inside the tissues, which allows faster switching of gradient fields. The PatLoc method has drawbacks, however. These drawbacks include a spatially varying point spread function ("PSF") and technical challenges in implementing the non-Cartesian gradient coils. In a related method referred to as "O-space imaging," second-order nonlinear gradient fields are used as encoding gradients, and the projections of the object onto sets of concentric rings are obtained for the reconstruction. One of the main disadvantages of O-space imaging and PatLoc imaging is the requirement of additional nonlinear gradient fields, which are not available in conventional MRI scanners. Additionally, because of the spatially-varying PSF, the spatial resolution varies by location inside the MRI system.

It would therefore be desirable to provide a method for accelerated magnetic resonance imaging ("MRI") that utilizes conventional linear gradients and high-quality, uniform spatial resolution with minimal image artifacts.

SUMMARY OF THE INVENTION

The present invention overcomes the aforementioned drawbacks by providing a method for highly accelerated projection imaging ("HAPI"). In this method, conventional linear gradients are used to obtain coil sensitivity-weighted projections of the object being imaged. It is contemplated that a two-dimensional image may be generated using the method of the present invention by acquiring a minimal amount of k-space data, for example a single line of k-space data may be used, unlike conventional radial imaging techniques. The method of the present invention does not require using multiple phase encoding steps or switching gradients multiple times to acquire two-dimensional k-space data; however, in some implementations it may be advantageous to make use of some phase encoding, such as to use one or two phase encodings for each radial projection similar to PROPELLER acquisition schemes. Thus, scan time is not wasted performing these phase encoding steps or switching gradients from positive to negative cycles. As a result, the method of the present invention is time-efficient, acoustic noise-efficient and less demanding on the MRI system hardware.

The relationship between the voxel values of the imaged object and the coil sensitivity-weighted projections is formulated as a linear system of equations and the reconstructed images are obtained by solving this matrix equation. This method advantageously allows higher acceleration rates compared to echo planar imaging ("EPI") with SENSE or GRAPPA acceleration. Moreover, the method does not require any additional or specialized hardware because existing hardware in any conventional MRI scanner is adequate to implement the method.

It is an aspect of the invention to provide a method for reconstructing an image of a subject using an MRI system and a radio frequency ("RF") receive coil array having a plurality of RF receive coils. The MRI system is used to acquire k-space data by sampling k-space along at least one trajectory. An RF receive coil sensitivity map is provided for each RF coil used to acquire the k-space data. At least one projection is produced by performing a one-dimensional Fourier transform on the k-space data sampled by the at least one trajectory, and a plurality of weights is determined. Each weight is determined by calculating an overlap of a ray corresponding to the at least one projection and a voxel at a voxel location in an image matrix. A matrix is then formed with each entry in the matrix determined by multiplying one of the plurality of weights by an RF receive coil sensitivity value from one of the provided RF receive coil sensitivity maps associated with the voxel location corresponding to the weight. An image of the subject is reconstructed by solving a system of equations that relates the formed matrix to the produced at least one projection.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

In the two-dimensional case, a magnetic resonance signal acquired from a single channel of a radio frequency ("RF") coil array using a projection imaging technique can be modeled as, $$s_w(t) = \iint f(x,y) C_w(x,y) e^{-i2\pi(G_x x + G_y y)t} dx\, dy \qquad (1);$$

where $f(x, y)$ is the object being imaged, $C_w(x, y)$ is the sensitivity of the $w^{th}$ RF coil in the RF coil array, and $G_x$ and $G_y$ are the gradient amplitudes. Magnetic resonance signal relaxation and off-resonance effects may be ignored to simplify the expression in Eqn. (1). For projection imaging, the gradient amplitudes, $G_x$ and $G_y$, may be modified as follows:

$$G_x = G \cos \theta \qquad (2);$$

$$G_y = G \sin \theta \qquad (3);$$

to yield the following relationship:

$$s_{w,\theta}(t) = \iint f(x,y) C_w(x,y) e^{-i2\pi G(x \cos\theta + y \sin\theta)t} dx\, dy \qquad (4).$$

The expression in Eqn. (4) can then be rewritten as, $$s_{w,\theta}(t) = \int \left( \iint f(x,y) C_w(x,y) \delta(x \cos\theta + y \sin\theta - q) dx\, dy \right) e^{-i2\pi G t q} dq \qquad (5).$$

Figure 1:
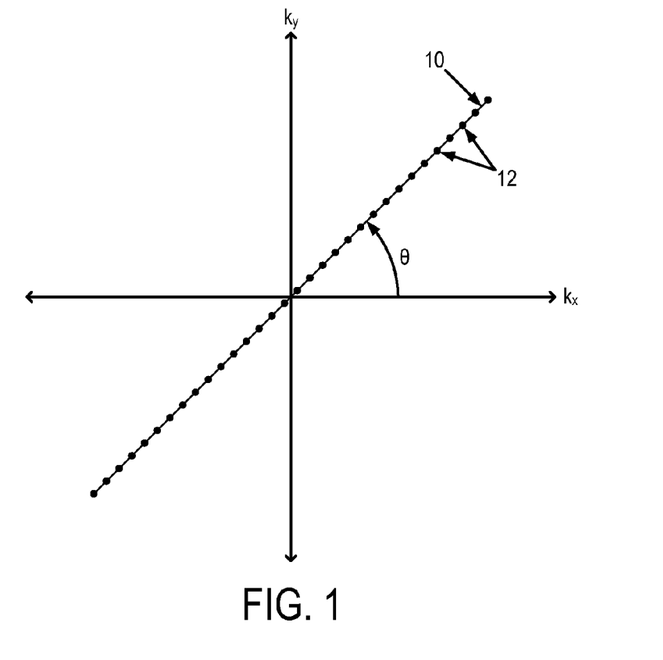
FIG. 1 is an example of a radial k-space trajectory defined by a plurality of sampling points on the trajectory.
Figure 2:
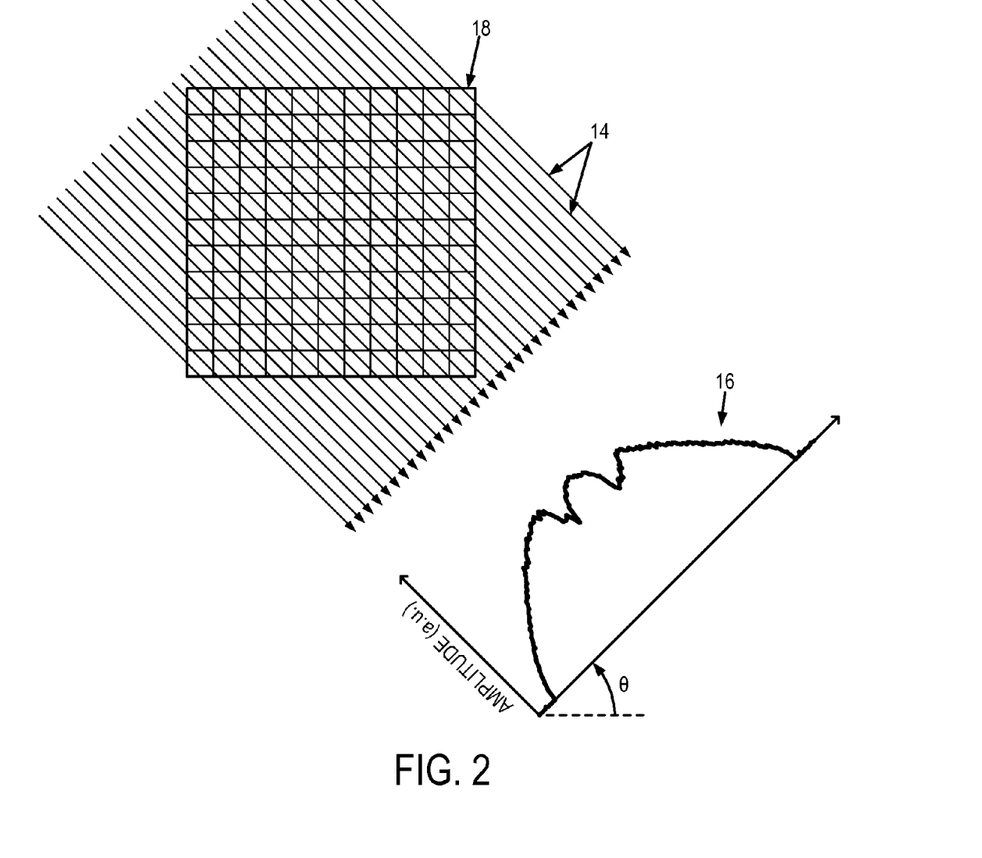
FIG. 2 is an example of rays in image space corresponding to the sampling points on the radial k-space trajectory of FIG. 1, and the corresponding projection computed as the one-dimensional Fourier transform of the k-space data of FIG. 1.

The relationship in Eqn. (5) demonstrates that the inverse one-dimensional Fourier transform of an acquired echo signal yields projections, $P_{w,\theta}$, of the coil sensitivity-weighted object along the line determined by the angle, $\theta$. The isofrequency paths in projection magnetic resonance imaging ("MRI") may be referred to as "rays" to simplify the terminology. By way of example, a single radial k-space trajectory 10 is illustrated in FIG. 1. This trajectory 10 is composed of a plurality of k-space sampling points 12. As shown in FIG. 2, each of the sampling points 12 shown in FIG. 1 defines a corresponding ray 14 in image space. Together, these rays 14 collectively form a projection 16, which as described above can be determined as the one-dimensional Fourier transform of the k-space data acquired by sampling k-space at the sample points 12 along the k-space trajectory 10, as shown in FIG. 1.

For the discrete case, a single matrix equation relating a vectorized form of the object, $f$, and projections 16, $p$, can be defined as follows:

$$p = Af \qquad (6);$$

which may be written as, $$\begin{bmatrix} a_{1,1} & a_{1,2} & \cdots & a_{1,N^2} \\ a_{2,1} & a_{2,2} & \cdots & a_{2,N^2} \\ \vdots & \vdots & \ddots & \vdots \\ a_{W \times M \times N_S, 1} & a_{W \times M \times N_S, 2} & \cdots & a_{W \times M \times N_S, N^2} \end{bmatrix} \begin{bmatrix} f_1 \\ \vdots \\ f_{N^2} \end{bmatrix} = \begin{bmatrix} p_1 \\ \vdots \\ p_{W \times M \times N_S} \end{bmatrix}; \qquad (7)$$

where the elements, $a_{ij}$, of the matrix, A, are determined by the areas of overlap between rays 14 and voxels in an image matrix 18, as well as the spatial distribution of RF receive coil sensitivities. The columns of the matrix, A, correspond to the spatial dimensions of the image matrix and the rows of the matrix, A, correspond to the measurements from different projections from each coil. If there are W RF coils in the RF coil array, and if M projections are acquired with $N_S$ sample points 12 on each projection, and if N is the size of the reconstructed image 18, then the matrix A is of size $[W \times M \times N_S, N^2]$.

Figure 3:
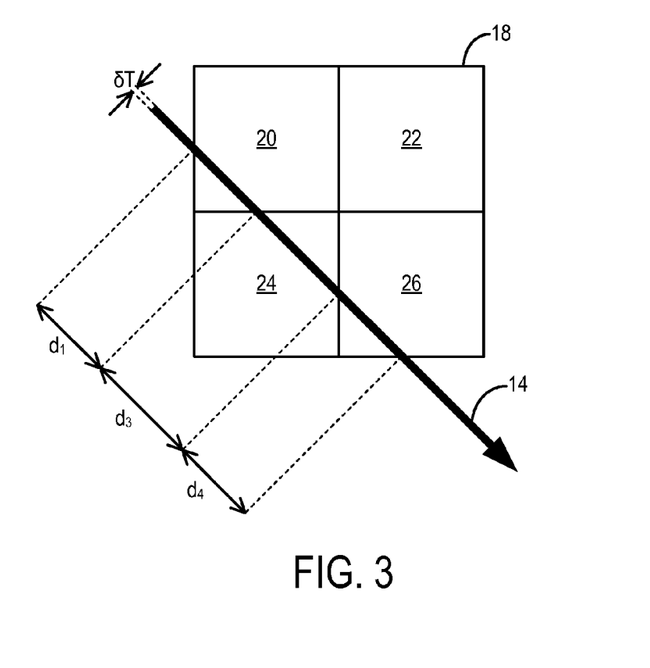
FIG. 3 is an example of a ray overlapping three different voxel location in an image matrix.

The matrix, A, may be formed as follows. Referring first to FIG. 3, the area of overlap between each ray 14 and the voxels in the image matrix 18 is determined. In the example illustrated in FIG. 3, an image matrix 18 includes four voxels 20, 22, 24, 26. The area of overlap between each voxel 20, 22, 24, 26 and a ray 14 that passes through the image matrix is determined as the area of the segment of the ray 14 passing through each respective voxel 20, 22, 24, 26. Thus, for the example in FIG. 3, the area of overlap for voxel 20 is approximately $d_1 \cdot \delta T$, the area of overlap for voxel 22 is zero because the ray 14 does not intersect voxel 22, the area of overlap for voxel 24 is approximately $d_3 \cdot \delta T$, and the area of overlap for voxel 26 is approximately $d_4 \cdot \delta T$, where $\delta T$ is the finite thickness of the ray 14. The area of overlap for a given ray and a given voxel can be readily determined using an appropriate method for calculating the area of two intersecting geometries and also because the physical dimensions of the image matrix 18 and ray 14 are known. The subscripts 1, 3, and 4 refer to voxels 20, 24, and 26 being the first, third, and fourth voxels in a vectorized version of the image matrix 18. It should also be appreciated that in three-dimensional applications, it is possible to calculate the volume of overlap between a ray and a given voxel.

Figure 4:
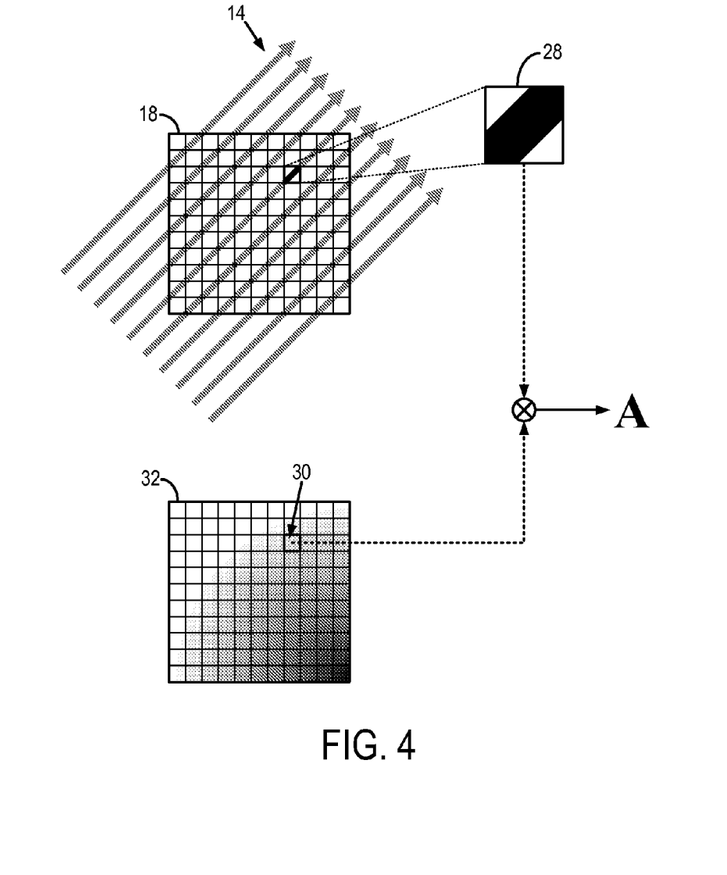
FIG. 4 is an illustration of the formation of an entry in a matrix that weights a portion of a ray, corresponding to a sampling point on a k-space trajectory, that overlaps a voxel location with coil sensitivity values for that voxel location.

Referring now to FIG. 4, with the areas of overlap determined, the matrix, A, may be formed as follows. For each voxel location in the image matrix 18, the area of the ray that overlaps that voxel is weighted by the RF coil sensitivity at that voxel location. Schematically, this relationship is shown in FIG. 4, where a portion of a ray 14 that overlaps a voxel 28 is shown to be weighted by the coil sensitivity 30 at the corresponding voxel location, as determined from a coil sensitivity map 32. In the instance where more than one ray overlaps a given voxel location, the adjacent rays sample the voxel with different weights. Thus, each ray can be written as a weighted sum of all voxels that it passes through, and a large number of such rays can be used to form a system of linear equations that can be solved to recover the image, f.

As noted above, the weighted sum of voxels from each projection is further weighted by distinct sensitivity information obtained from each channel of an RF coil array, thereby providing additional degrees of freedom for solving the inverse problem in Eqn. (6). This information is encoded in the A matrix and used in the reconstruction of the image, f, of the object. If the A matrix is invertible, then Eqn. (6) can be solved for f and the image can be obtained. By way of example, a Sparse Equations and Least Squares method may be used for matrix inversion. This method is a conjugate-gradient type method for solving sparse linear equations. It will be appreciated by those skilled in the art that many other matrix inversion techniques can also be suitably utilized when solving Eqn. (6).

Figure 5A:
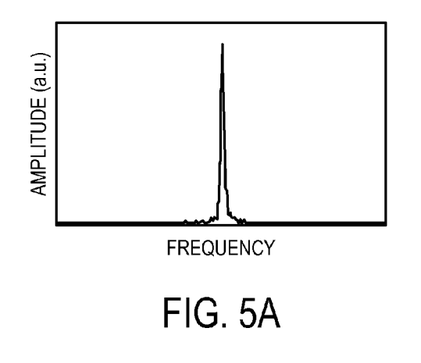
FIG. 5A is a plot of an echo signal sampled along a k-space trajectory.
Figure 5B:
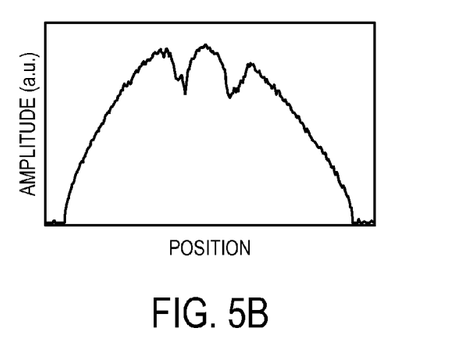
FIG. 5B is a plot of a projection formed by performing a one-dimensional Fourier transform on the echo signal of FIG. 5A.

As illustrated in FIGS. 5A and 5B, the projection vector, p, in Eqn. (6) may be formed by applying a one-dimensional Fourier transform to each acquired line of k-space data. For example, FIG. 5A illustrates an example of an echo signal acquired by sampling k-space along a radial trajectory, such as one of those illustrated in FIG. 4. Continuing with this example, FIG. 5B illustrates an example of the one-dimensional Fourier transform of the echo signal in FIG. 5A. Thus, FIG. 5B illustrates an example of a projection contained in the projection vector, p.

Figure 6:
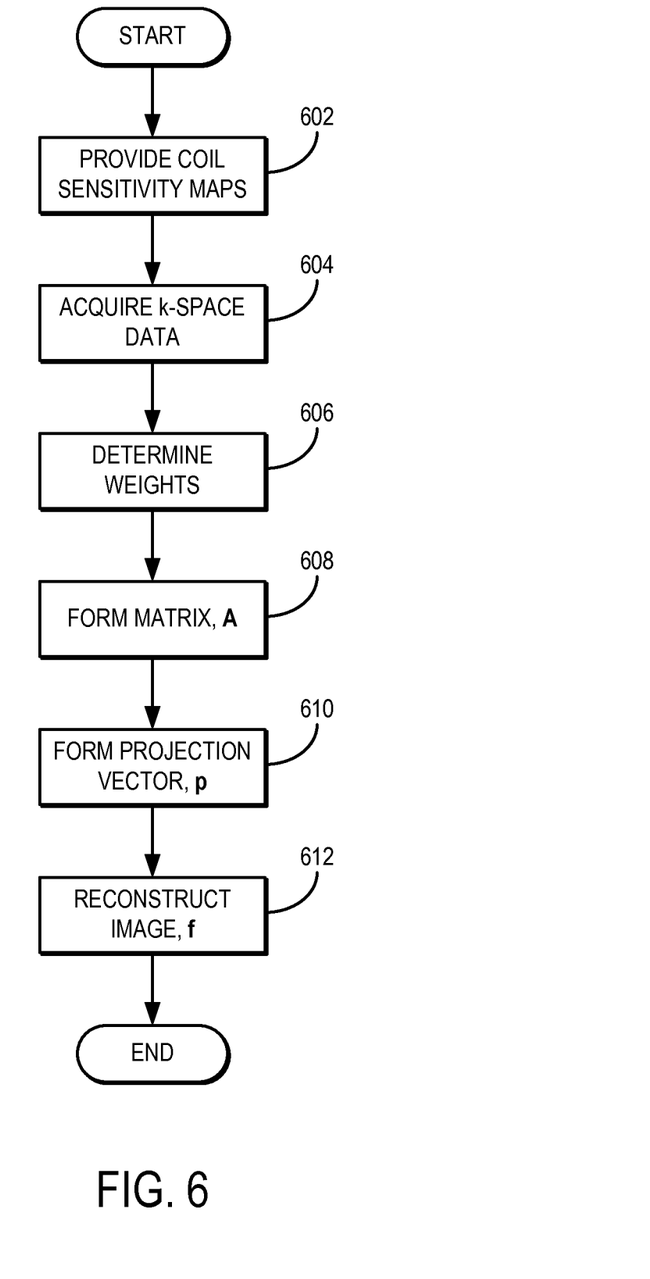
FIG. 6 is a flowchart setting forth the steps of an example of a method for single projection imaging with coil sensitivity encoding.
Figure 7:
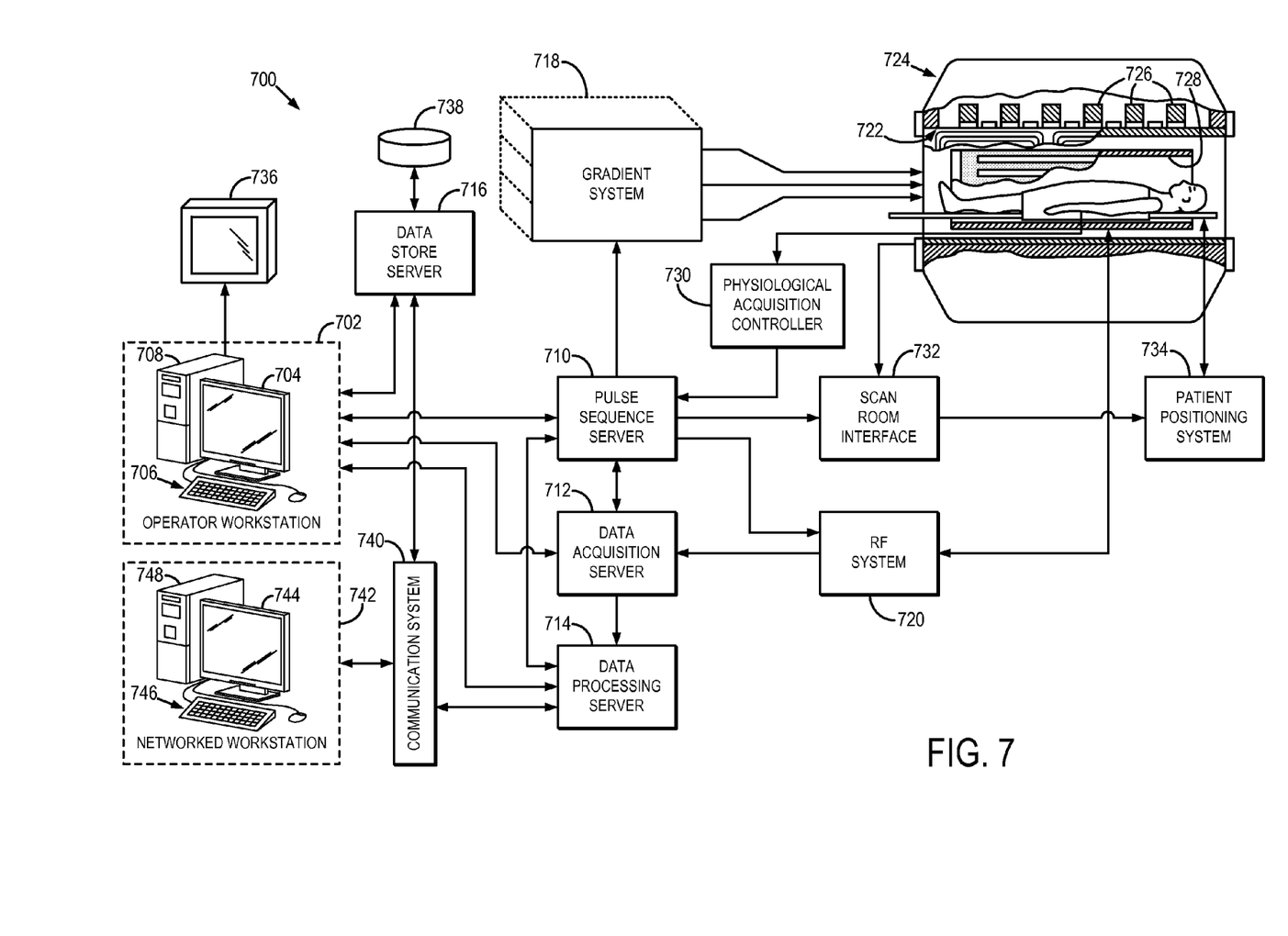
FIG. 7 is a block diagram of an example of a magnetic resonance imaging ("MRI") system.

Referring now to FIG. 6, a flowchart setting forth the steps of an example of a method for highly accelerated projection imaging ("HAPI") is illustrated. With such a method, images can be obtained at extremely fast rates compared to existing imaging techniques. The method begins by providing coil sensitivity maps for each RF coil in the RF coil array, as illustrated at step 602. The coil sensitivity maps may be provided by acquiring the coil sensitivity maps using a prescan before imaging the subject, may be provided from a stored database containing coil sensitivity maps acquired at a different time, or may be formed from the data acquired in step 604. The method then proceeds by acquiring k-space data with an MRI system, as illustrated at step 604. By way of example, k-space data is obtained by sampling k-space along one or more radial trajectories. It will be appreciated by those skilled in the art, however, that k-space may also be sampled along other trajectories, such as lines on a Cartesian grid, spiral trajectories, and other curves. As an example, a PROPELLER acquisition-scheme may be used to acquire k-space data.

Novel projection acquisition schemes can be developed for efficient and fast acquisition of k-space data. Although the most straightforward approach may be to acquire several projections using a fast spin-echo or a gradient-echo pulse sequence with very short repetition time ("TR"), multiple projections can also be acquired by cycling the gradients, similar to an echo planar imaging ("EPI") scan, but with substantially fewer gradient switching cycles. Appropriate gradient waveforms would allow acquisition of two or more projections quickly within several milliseconds. Moreover, k-space does not need to be acquired as linear radial lines, as noted above. The amplitude of the gradients can be varied slightly as the acquisition crosses origin of the k-space, which would change the angle of the projection at the origin, thereby resulting in two distinct spokes extending radially outward from the origin. The conjugate-symmetry property could be used to complete the missing part of the projection as in partial k-space acquisitions. This scheme would increase the number of projections without increasing the scan time.

It is contemplated that a two-dimensional image may be generated using the method of the present invention by acquiring a minimal amount of k-space data, for example only one line of k-space data may be used. Additionally, the k-space data can be acquired in a short time, such as less than ten milliseconds. As an example, it has been demonstrated that images with high spatial resolution and negligible artifacts can be reconstructed from fewer than sixteen projections. As an example, images with high spatial resolution and negligible artifacts were reconstructed from as few as eight projections and images with acceptable resolution and artifacts were obtained from as few as four projections using experimental data. It is possible, however, that a two-dimensional image may be reconstructed from a single projection with improvements in data acquisition and image reconstruction.

In the method described here, rays are sampled more densely than compared to conventional radial MRI techniques. For instance, in conventional radial imaging it may be typical to acquire 100 projections with 64 samples per projection to reconstruct a 64×64 image. Using the method described here, however, a 64×64 image can be reconstructed from only a few projections, but would make use of more than 64 samples on each of those projections. As a result, the method of the present invention samples each projection more densely than convention radial MRI techniques and thereby eliminates the time wasted during multiple RF excitations for multi-spoke radial imaging (or phase encoding steps for Cartesian imaging). The result of this sampling is a very efficient acquisition scheme because no time is lost for multiple excitations or phase encoding and gradient cycling periods. The data is still undersampled, similar to other parallel imaging techniques, and images are reconstructed as described above.

Dense sampling of a projection results in multiple rays passing through each voxel. Because adjacent rays will cross a voxel by different amounts, the overlapping areas between a voxel and adjacent rays in a projection provide independent measurements of that voxel. This is one of the discoveries of the present invention that can allow the reconstruction of an object from a single k-space line. In general, as the number of sampling points, $N_S$, increases, the condition number of the matrix, A, will improve. Thus, increasing the number of sampling points, $N_S$, allows fewer k-space lines to be acquired for substantially the same quality of reconstructed image.

It should be noted that dense sampling imposes some constraints on the resolution of the reconstructed images. For example, if higher image resolution is desired, more samples could be acquired for each k-space line, or more k-space lines can be acquired. In addition, RF coil arrays with more elements could be used to improve the condition number of the matrix, A, with fewer samples per projection. Minimum voxel size is mainly determined by the maximum gradient strength and data sampling rate, similar to other fast MRI techniques.

It is also contemplated that the performance of this imaging method can be improved upon by, for example, acquiring data only at preselected, optimal projection angles. For instance, every projection angle is not going to result in a well-conditioned matrix, A, even if the number of samples per k-space trajectory is increased. As an example, adjacent rays cover the same amount of area, and thus have the same weight, inside the voxel in vertical or horizontal projections. Therefore, the equations resulting from these rays will be linearly dependent and will not provide new information. Similar cases can be observed for projections at forty-five degrees or its multiples. As a consequence, the condition number of the matrix, A, may be improved by using projection angles other than zero degrees or multiples of forty-five degrees. This approach would provide that adjacent rays in a projection yield more distinct measurements of the corresponding voxel. By way of example, an automated search algorithm can be used to generate a set of projection angles that reconstruct images such that errors are minimized.

After k-space data is acquired, image reconstruction proceeds. First, weights that are defined by the area of overlap between rays and an image matrix are determined, as illustrated at step 606. Then, as illustrated at step 608, a formulation between projections computed from the acquired data and the target image is made and the A matrix is formed. This step includes, as discussed above, producing matrix entries that include applying the weights determined in step 606 to the coil sensitivity map values at the voxel locations associated with the weights. A projection vector, p, is also formed by Fourier transforming the k-space data, as indicated at step 610. For example, each line in the k-space data is Fourier transformed using a one-dimensional Fourier transform. After the A matrix and the projection vector, p, are formed, Eqn. (6) is solved to obtain the image, f, as indicated at step 612. For example, a set of sparse linear equations may be formed and solved using a least squares technique to obtain the image, f. Other techniques may be used to reconstruct the image. For example, regularization and iterative reconstruction methods, such as ART or FOCUSS could be used to reduce artifacts and improve signal-to-noise ratio ("SNR"). It is also contemplated that other advantages could be realized by using phase information in addition to the magnitude data in the reconstruction. Phase errors can be corrected using techniques similar to partial k-space acquisition methods so that complex-valued k-space data could be utilized to reconstruct the image.

It is contemplated that the aforementioned imaging technique can be improved by utilizing an RF coil array with more than eight RF coil elements, which would increase the degrees of freedom for the image reconstruction process analogous to conventional SENSE or GRAPPA accelerations. A more accurate calculation of the coil sensitivity maps could also improve image quality and reduce artifacts. In addition, special RF coil arrays could be designed to minimize artifacts and maximize signal-to-noise ratio ("SNR"), similar to the technique described by L. T. Muftuler, et al., in "An Inverse Method to Design RF Coil Arrays Optimized for SENSE Imaging," *Phys. Med. Biol.*, 2006; 51:6457-6469, and by G. Chen, et al., in "An Optimization Method for Designing SENSE Imaging RF Coil Arrays," *J. Magn. Reson.*, 2007; 186:273-281. Imperfections in gradient coil fields can also be incorporated into the A matrix and geometric distortions can be corrected.

The imaging technique may also be improved by incorporating a priori information from other magnetic resonance images of the same subject, which may improve quality and minimize artifacts. The reconstruction algorithm can be formulated to utilize the mutual anatomic information from these other images so that higher quality images can be reconstructed with fewer projections, thereby allowing higher temporal resolution.

In the method of the present invention, as in the majority of all digital imaging techniques, the object is discretized into voxels of identical size and the intensity of each voxel is assumed to be constant. Therefore, the areas of overlap between a voxel and adjacent rays in a projection provide independent measurements of that voxel. This fact allows the reconstruction of the object from a single k-space line using the present invention. Although the conventional uniform Cartesian grid is mentioned for image reconstruction above, other grid structures, such as those with triangular or hexagonal voxels, may yield more accurate results depending on the geometry of the imaged object. Additionally, adaptive gridding may be used, which would assemble a finer grid in selected regions of interest to increase the resolution in those areas. It is noted that all of these improvements can be achieved by making necessary changes in the reconstruction process, which is independent from the data acquisition.

The method of the present invention can be implemented in connection with other imaging techniques. For example, the method can be incorporated into a HYPR imaging technique, such as the one described in U.S. Pat. No. 7,519,412. For example, the number of projections in each of the HYPR time frames can be further reduced by implementing the method of the present invention, thereby producing images with higher fidelity at each time frame while allowing much faster frame rates. Moreover, higher quality composite images for use in the HYPR technique could also be produced from the acquired projections. It is contemplated that this combination of imaging techniques would yield a substantially increased temporal resolution while preserving high spatial resolution.

The method of the present invention can also be implemented to utilize parallel transmit methods, in which each element of a transmit RF coil array can be driven independently such that spatially varying amplitude and phase excitation patterns can be generated. By utilizing parallel transmit methods, the condition number of the matrix, A, could be further improved, thereby resulting in higher image quality.

Thus, a method for highly accelerated projection imaging ("HAPI") has been provided. Multiple rays passing through a voxel provide independent measurements for the voxel, thereby reducing the need for extra phase encoding steps. As a result, acceleration rates higher than SENSE or GRAPPA may be achieved without severe penalties in SNR and image artifacts. Such fast data acquisition schemes reduce the power loading on the gradient system, thereby improving performance and speed, and reducing acoustic noise and eddy currents. Applications such as dynamic imaging of the cardiovascular system or functional MRI ("fMRI") could benefit from the increased imaging speed. Shorter echo times, and hence higher SNR, can be achieved in diffusion imaging techniques using this method. It is also contemplated that TRs can be significantly shortened due to the reduced data acquisition time per slice, and that gradient system loading can be reduced. In some cases, the MRI system adjusts TR to limit root mean square ("RMS") power load on the gradient amplifiers and coils. Because the method of the present invention allows for a reduction in total acquisition time, advanced imaging techniques such as diffusion spectrum imaging can be made more feasible.

Although the method of the present invention was described with respect to a two-dimensional imaging technique, it will be appreciated by those skilled in the art that the imaging technique may be readily adapted to three-dimensional imaging. For example, projections acquired in three-dimensional k-space can be combined with three-dimensional coil sensitivity profiles to estimate values of voxels in a three-dimensional image.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for reconstructing an image of a subject using a magnetic resonance imaging (MRI) system and a radio frequency (RF) receive coil array having a plurality of RF receive coils, the steps of the method comprising:
   a) acquiring k-space data with the MRI system by sampling k-space along at least one trajectory;
   b) providing an RF receive coil sensitivity map for each RF coil used to acquire the k-space data in step a);
   c) producing at least one projection by performing a one-dimensional Fourier transform on the k-space data sampled by the at least one trajectory;
   d) determining a plurality of weights, each weight being determined by calculating an overlap of a ray corresponding to the at least one projection and a voxel at a voxel location in an image matrix;
   e) forming a matrix with each entry determined by multiplying one of the plurality of weights determined in step d) by an RF receive coil sensitivity value from one of the provided RF receive coil sensitivity maps associated with the voxel location corresponding to the weight; and
   f) reconstructing the image of the subject by solving a system of equations that relates the matrix formed in step e) to the at least one projection produced in step c).

2. The method as recited in claim 1 in which step a) includes sampling k-space along at least one radial trajectory.

3. The method as recited in claim 2 in which the at least one radial trajectory comprises a plurality of radial trajectories oriented in k-space by an angle rotated about an origin of k-space.

4. The method as recited in claim 3 in which each of the plurality of radial trajectories is oriented in k-space by an angle that is not zero or a multiple of forty-five degrees.

5. The method as recited in claim 1 in which the at least one k-space trajectory acquired in step a) includes a plurality of k-space sampling points distributed along the at least one k-space trajectory, and each k-space sampling point is associated with a ray in image space.

6. The method as recited in claim 1 in which step b) includes providing the RF receive coil sensitivity maps by performing a prescan.

7. The method as recited in claim 1 in which step b) includes providing the RF receive coil sensitivity maps by producing the RF receive coil sensitivity maps from the k-space data acquired in step a).

8. A method for reconstructing an image of a subject with a magnetic resonance imaging (MRI) system and a radio frequency (RF) receive coil array having a plurality of RF receive coils, the steps of the method comprising:
   a) providing an RF receive coil sensitivity map for each RF coil in the RF receive coil array;
   b) acquiring k-space data with the MRI system by sampling k-space along a radial trajectory that is oriented at an angle about a k-space origin;
   c) producing a projection by applying a one-dimensional Fourier transform to the k-space data, the projection being associated with a plurality of rays through image space, each ray being oriented at a view angle that is perpendicular to the angle of the radial trajectory;
   d) determining an overlap between each of the plurality of rays and each voxel in an image matrix;
   e) producing a plurality of weighting factors by multiplying an RF receive coil sensitivity value from each RF receive coil sensitivity map by one of the overlaps determined in step d); and
   e) reconstructing an image by solving a system of equations that relates the projection produced in step c) to a weighted sum of image values in the image matrix weighted by each of the plurality of weighting factors.

9. The method as recited in claim 8 in which:
   step b) is repeated a plurality of times to acquire k-space data associated with a plurality of radial trajectories each oriented in k-space at a different angle;
   step c) is repeated to produce a different projection for each of the plurality of radial trajectories; and
   step d) is repeated to determine overlaps between voxels in the image matrix and each ray associated with each different projection.

10. The method as recited in claim 8 in which the angle about a k-space origin is not zero or a multiple of forty-five degrees.

11. A magnetic resonance imaging (MRI) system comprising:
   a magnet system configured to generate a polarizing magnetic field about at least a portion of a subject arranged in the MRI system;
   a plurality of gradient coils configured to apply a magnetic gradient field to the polarizing magnetic field;
   a radio frequency (RF) system including at least one RF transmit coil configured to apply an RF field to the subject and an array of RF receive coils capable of receiving magnetic resonance signals therefrom;
   a computer system programmed to:
      provide an RF receive coil sensitivity map for each RF receive coil in the array of RF receive coils;
      direct the gradient coils and the RF system to perform a pulse sequence such that k-space data is acquired by sampling k-space along a plurality of k-space trajectories;
      produce a plurality of projections by applying a one-dimensional Fourier transform to the k-space data associated with each of the plurality of k-space trajectories;

form a matrix with entries that include areas of overlap between rays in image space that intersect the plurality of projections and voxels in an image matrix for the image, the areas of overlap being weighted by RF receive coil sensitivities; and reconstruct the image of the subject by solving a system of equations that relates the formed matrix to the plurality of projections.

12. The MRI system as recited in claim 11 in which the computer system is programmed to direct the gradient coils and the RF system to perform a pulse sequence such that k-space data is acquired by sampling k-space along a plurality of radial k-space trajectories.

13. The MRI system as recited in claim 12 in which the computer system is programmed to direct the gradient coils and the RF system to perform a pulse sequence such that each of the plurality of radial k-space trajectories is oriented in k-space by an angle rotated about a k-space origin.

14. The MRI system as recited in claim 13 in which the computer system is programmed to direct the gradient coils and the RF system to perform a pulse sequence such that each of the plurality of radial k-space trajectories is oriented in k-space by an angle rotated about a k-space origin that is not zero or a multiple of forty-five degrees.

15. The MRI system as recited in claim 11 in which the computer system is programmed to provide the RF receive coil sensitivity maps by directing the gradient coils and the RF system to perform a prescan.

16. The MRI system as recited in claim 11 in which the computer system is programmed to provide the RF receive coil sensitivity maps by producing the RF receive coil sensitivity maps from the acquired k-space data.

17. The MRI system as recited in claim 11 in which the at least one RF transmit coil in the RF system is an array of RF transmit coils.

* * * * *